(12) United States Patent
Jung et al.

(10) Patent No.: US 8,685,757 B2
(45) Date of Patent: Apr. 1, 2014

(54) METHOD FOR FABRICATING MAGNETIC TUNNEL JUNCTION

(75) Inventors: Dong Ha Jung, Yongin-si (KR); Gyu An Jin, Suwon-si (KR); Su Ryun Min, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 260 days.

(21) Appl. No.: 13/331,546

(22) Filed: Dec. 20, 2011

(65) Prior Publication Data

US 2012/0187510 A1 Jul. 26, 2012

(30) Foreign Application Priority Data

Jan. 24, 2011 (KR) .................. 10-2011-0006706

(51) Int. Cl.
*H01L 21/00* (2006.01)

(52) U.S. Cl.
USPC ............ 438/3; 438/728; 438/732; 438/776; 257/E29.323; 257/E43.006; 360/313; 360/314; 360/317

(58) Field of Classification Search
USPC ............ 438/3, 510, 535, 676, 707, 728, 732, 438/746, 758, 771, 776; 257/414, 421–428, 257/659, E21, E29.323, E43.004, E43.006; 360/313, 314, 317, 318, 319, 323, 340
See application file for complete search history.

(56) References Cited

U.S. PATENT DOCUMENTS

| 4,700,252 A | * | 10/1987 | Muraoka et al. ............. 360/321 |
| 2005/0237674 A1 | * | 10/2005 | Shimazawa et al. ......... 360/314 |
| 2007/0242391 A1 | * | 10/2007 | Yamaguchi et al. ......... 360/319 |

FOREIGN PATENT DOCUMENTS

| JP | 2004-096014 | 3/2004 |
| JP | 2005-044848 | 2/2005 |
| JP | 2007-324215 | 12/2007 |

* cited by examiner

*Primary Examiner* — Charles Garber
*Assistant Examiner* — Abdulfattah Mustapha
(74) *Attorney, Agent, or Firm* — IP & T Group LLP

(57) ABSTRACT

A method for fabricating a magnetic tunnel junction element includes forming a magneto resistance layer including a first magnetic layer, an insulation layer and a second magnetic layer on a substrate, forming a magnetic loss area by doping a magnetic loss impurity into a region of the magneto resistance layer to cause a magnetic loss, and etching the magnetic loss area to form a magnetic tunnel junction element.

16 Claims, 7 Drawing Sheets

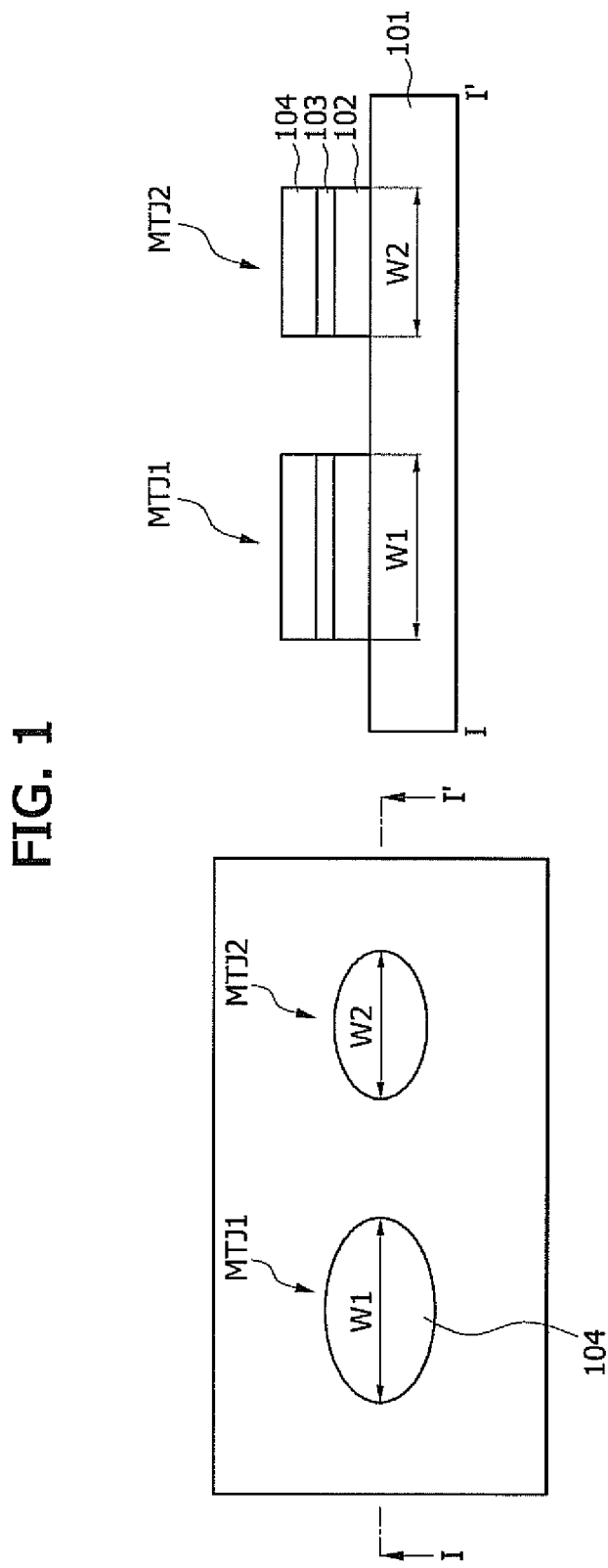

FIG. 2B
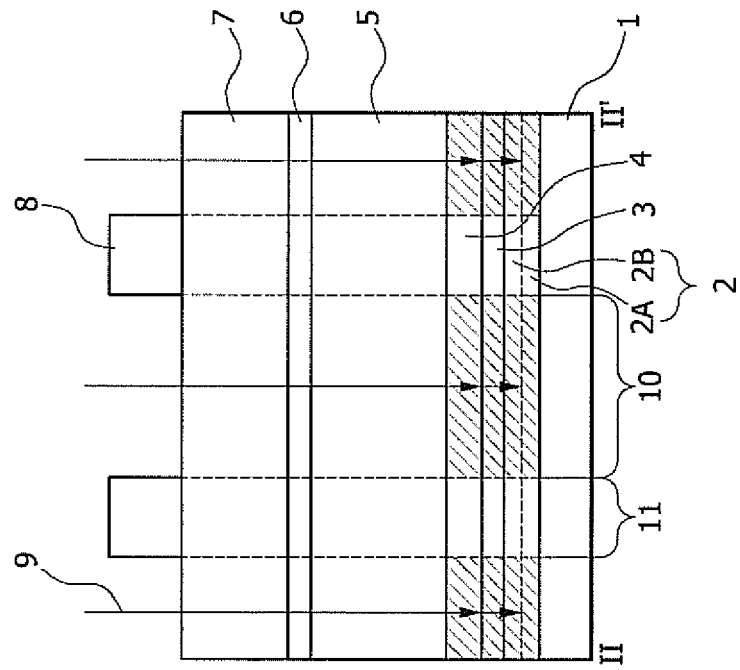
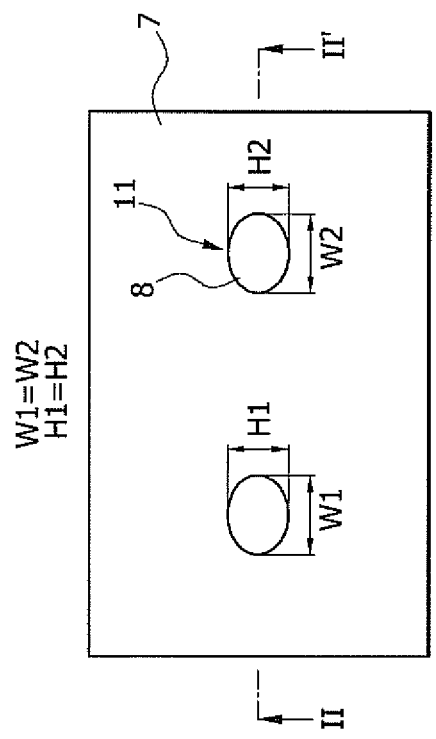

FIG. 2E
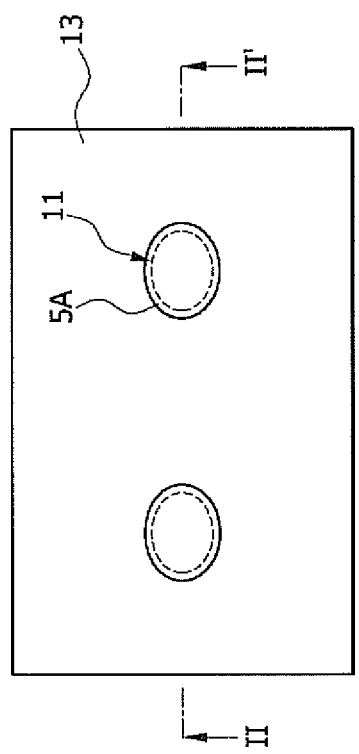
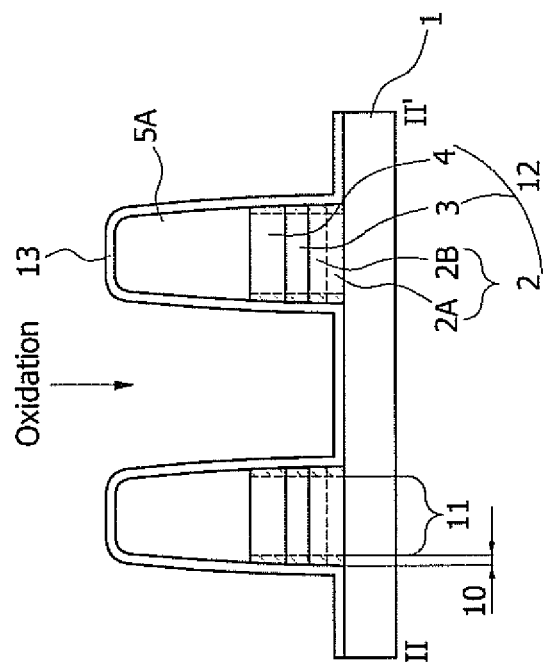

FIG. 2F
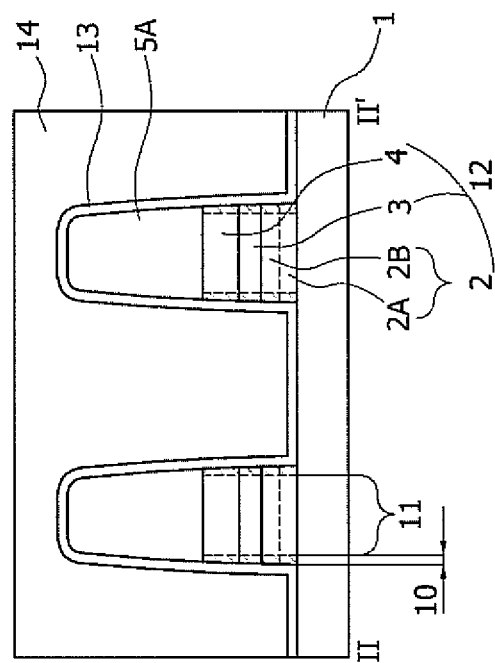
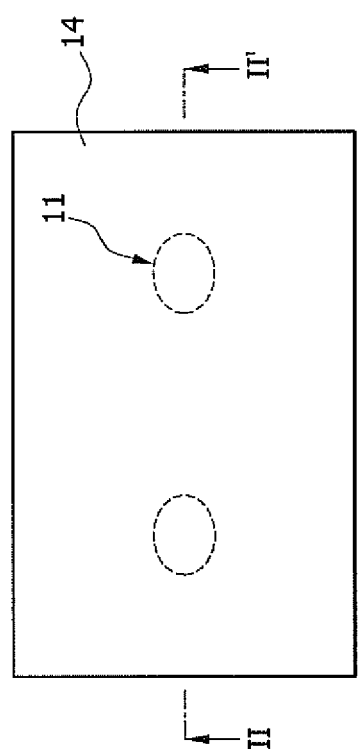

METHOD FOR FABRICATING MAGNETIC TUNNEL JUNCTION

CROSS-REFERENCE TO RELATED APPLICATIONS

The present application claims priority of Korean Patent Application No. 10-2011-0006706, filed on Jan. 24, 2011, which is incorporated herein by reference in its entirety.

BACKGROUND OF THE INVENTION

Exemplary embodiments of the present invention relate to a method for fabricating a magnetic tunnel junction, and more particularly, to a method for fabricating magnetic tunnel junctions having a uniform critical dimension (CD).

A dynamic random access memory (DRAM) and a flash memory device are representative of semiconductor devices. Here, the DRAM has a fast data processing speed due to easier data access, whereas the flash memory device stores nonvolatile data. Further, the DRAM periodically refreshes data, whereas the flash memory device has a slow data processing speed due to more difficult data access.

Recently, semiconductor devices combining benefits of both the DRAM and the flash memory device have been developed. An exemplary semiconductor device is a spin transfer random access memory, which uses the quantum mechanical effect, i.e., magneto resistance. The spin transfer random access memory has the easier data accessibility of the DRAM and the non-volatile data storage capacity of the flash memory device.

The spin transfer random access memory includes a magnetic tunnel junction to store data. Generally, the magneto resistance (MR) is changed depending on the magnetization direction between two ferromagnetic layers. The spin transfer random access memory senses a change in magneto resistance and reads whether data stored in the magnetic tunnel junction is 1 or 0.

FIG. 1 illustrates a plan view of a conventional magnetic tunnel junction and a sectional view taken along line of the magnetic tunnel junction.

As illustrated in FIG. 1, the magnetic tunnel junction includes a first magnetic layer 102, an insulation layer 103 and a second magnetic layer 104, which are formed on a substrate 101. The first magnetic layer 102 is a layer of which magnetization direction is fixed, and a second magnetic layer 104 is a layer of which magnetization direction is changed depending on a supply direction of current.

If the magnetization directions of the first and second magnetic layers 102 and 104 are the same, the resistance of the magnetic tunnel junction is low. If the magnetization directions of the first and second magnetic layers 102 and 104 are opposite to each other, the resistance of the magnetic tunnel junction is high. According to these characteristics, the magnetic tunnel junction reads data by supplying current between the first and second magnetic layers 102 and 104 and measuring the resistance of the magnetic tunnel junction.

Here, critical dimensions (CDs) of magnetic tunnel junctions may be changed in a process of patterning the magnetic tunnel junctions. In FIG. 1, the lateral width W1 of a first magnetic tunnel junction MTJ1 is patterned larger than the lateral width W2 of a second magnetic tunnel junction MTJ2. Also, the longitudinal width of the first magnetic tunnel junction MTJ1 is patterned larger than that of the second magnetic tunnel junction MTJ2. This is because distributions of etch plasma in the magnetic tunnel junctions MTJ1 and MTJ2 are different for each other in the process of patterning the magnetic tunnel junctions MTJ1 and MTJ2. In a case where the CDs of the magnetic tunnel junctions are different from each other, tunneling magneto resistances (TMRs) and resistances of area factors (RAs) in the magnetic tunnel junctions are different from each other and makes it difficult to read data. Here, the TMR and RA are magnetization characteristics of the magnetic tunnel junction.

SUMMARY OF THE INVENTION

An embodiment of the present invention is directed to a method for fabricating magnetic tunnel junctions having a uniform CD.

In accordance with an embodiment of the present invention, a method for fabricating a magnetic tunnel junction includes forming a magneto resistance layer on a substrate, wherein the magneto resistance layer comprises a first magnetic layer, an insulation layer and a second magnetic layer; forming a magnetic loss area by doping a magnetic loss impurity into a region of the magneto resistance layer to cause a magnetic loss; and etching the magnetic loss area to form the magnetic tunnel junction.

BRIEF DESCRIPTION OF THE DRAWINGS

FIG. 1 illustrates a plan view of a conventional magnetic tunnel junction and a sectional view taken along line I-I' of the magnetic tunnel junction.

FIGS. 2A to 2F illustrate plan views of a magnetic tunnel junction and sectional views taken along line II-II' of the magnetic tunnel junction, illustrating a method for fabricating the magnetic tunnel junction in accordance with an embodiment of the present invention.

DESCRIPTION OF SPECIFIC EMBODIMENTS

Figure 2A:
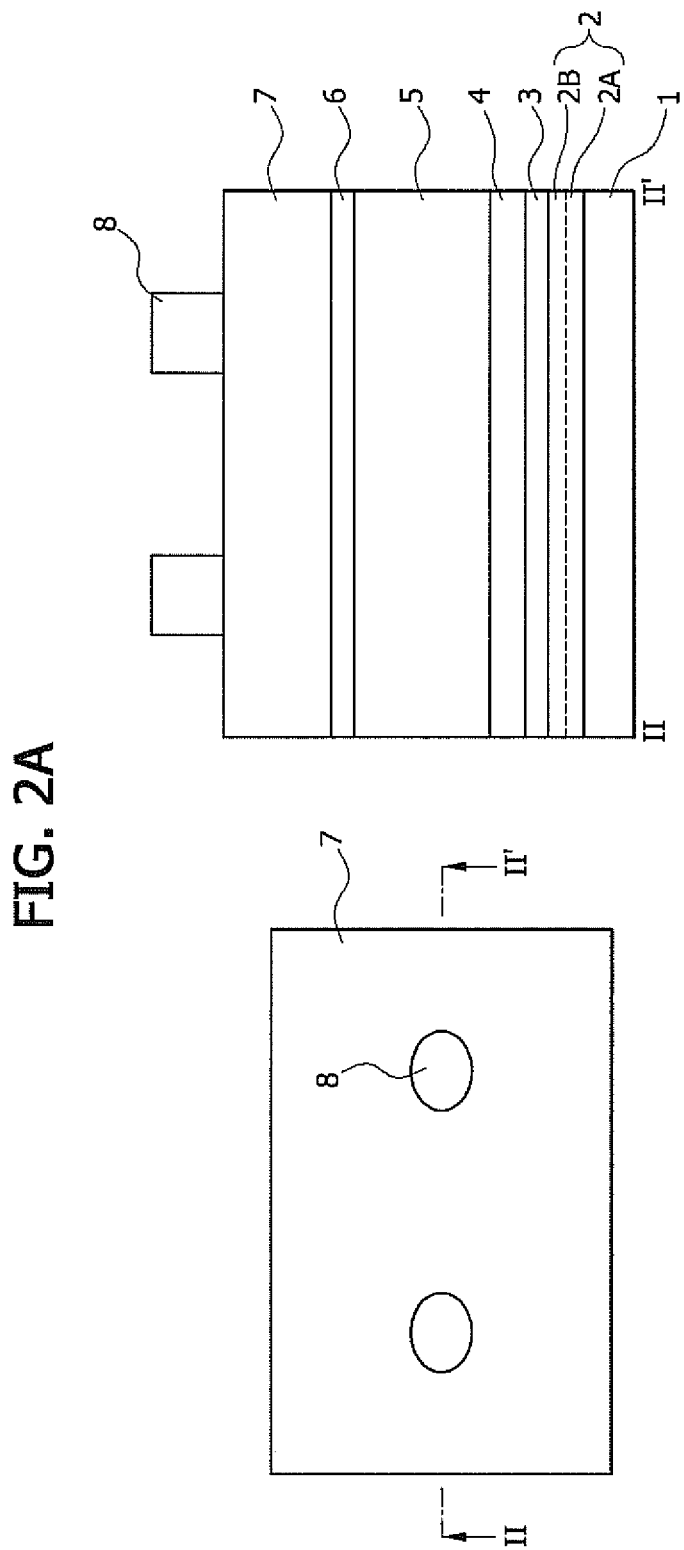

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIGS. 2A to 2F illustrate plan views of a magnetic tunnel junction and sectional views taken along line II-II' of the magnetic tunnel junction, illustrating a method for fabricating the magnetic tunnel junction in accordance with an embodiment of the present invention.

As illustrated in FIG. 2A, a first magnetic layer 2 is formed on a substrate having a bottom layer 1 formed therein.

The bottom layer 1 includes a cell transistor for selecting a magnetic tunnel junction and a contact plug for connecting a junction area of the cell transistor and the magnetic tunnel junction. Here, the contact plug is also referred to as a bottom electrode.

The first magnetic layer 2 includes a diamagnetic layer referred to as a pinning layer 2A and a ferromagnetic layer referred to as a pinned layer 2B. The pinning layer 2A functions to fix the magnetization direction of the pinned layer 2B. To this end, the pinning layer 2A is formed of a thin film made of at least one selected from the group consisting of IrMn, PtMn, MnO, MnS, MnTe, $MnF_2$, $FeF_2$, $FeCl_2$, FeO, $CoCl_2$, CoO, $NiCl_2$ and NiO. The magnetization direction of the pinned layer 2B is fixed by the pinning layer 2A. To this end, the pinned layer 2B is formed of a thin film made of at least one selected from the group consisting of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, EuO and $Y_3Fe_5O_{12}$.

Subsequently, an insulation layer 3 is formed on the first magnetic layer 2.

The insulation layer 3 may be a MgO layer. Alternatively, the insulation layer 3 may be formed of a Group-TV semiconductor layer or may be formed by adding a Group-III or Group V element such as B, P or As to the Group-IV semiconductor layer so as to control the electric conductivity thereof.

Subsequently, a second magnetic layer 4 is formed on the insulation layer 3.

The magnetization of the second magnetic layer 4 is changed depending on the supply direction of current. The second magnetic layer 4 is formed of a thin film made of at least one selected from the group consisting of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, EuO and $Y_3Fe_5O_{12}$.

Hereinafter, the first magnetic layer 2, the insulation layer 3 and the second magnetic layer 4 are together referred to as a magneto resistance layer.

Subsequently, a hard mask layer 5 is formed on the second magnetic layer 4.

The hard mask layer 5 protects the magnetic tunnel junction and acts as a top electrode. The hard mask layer 5 is used as an etch barrier for etching the second magnetic layer 4, the insulation layer 3 and the first magnetic layer 2. To this end, the hard mask layer 5 is formed of tungsten (W).

Subsequently, an etch barrier layer 6, an anti-reflection layer 7 and mask patterns 8 are sequentially formed on the hard mask layer 5.

The etch barrier layer 6 is a thin film for preserving an etch margin of the mask pattern 8. Here, the etch barrier layer 6 in addition to the mask pattern 8 is used to etch the mask pattern 8. To this end, the etch barrier layer 6 is formed of amorphous carbon (a-carbon).

The anti-reflection layer 7 prevents the profile of the mask pattern 8 from being changed by reflection of light in a process of forming the mask pattern 8, i.e., an exposure process. According to an example, the anti-reflection layer 7 is formed of silicon nitride ($Si_3N_4$).

The mask pattern 8 is a thin film for defining the profile of the magnetic tunnel junction, and each constituent of the mask pattern 8 defines one magnetic tunnel junction. Constituents of the mask pattern 8 are formed to have the uniform size throughout and are formed using a photo-resist.

As illustrated in FIG. 2B, a magnetic loss impurity 9 is doped into the magneto resistance layer using the mask pattern 8 as an ion implantation mask. Here, the doping is performed by ion implantation.

As described above, the mask pattern 8 defines the profile of the magnetic tunnel junction. Accordingly, the magneto resistance layer (3 and 4) into which the magnetic loss impurity 9 is not doped by the mask pattern 8 is an area to act as the magnetic tunnel junction, i.e., a magnetic area 11, and the magneto resistance layer doped with the magnetic loss impurity 9 is an area not to act as the magnetic tunnel junction, i.e., a magnetic loss area 10. The magnetic area 11 substantially becomes a CD of the magnetic tunnel junction. Since the sizes of constituents of the mask pattern 8 are the same, the heights H1 and H2 of the magnetic areas 11 are the same, and the widths W1 and W2 of the magnetic areas 11 are the same. The same heights and widths mean that CDs of the magnetic areas 11 are the same.

The magnetic loss impurity 9 is an impurity that causes loss of magnetic properties of the magneto resistance layer and may be any reasonably suitable element such as Ga, Ge, As and In. Here, Ga, Ge, As and In are non-magnetic. Since the Ga, Ge, As and In have a property in which they are not diffused even at a high temperature, no diffusion occurs after being doped into the magneto resistance layer. This means that the Ga, Ge, As and In can prevent the magnetic area 11 from getting smaller due to expansion of the magnetic loss area 10 from diffusion.

Figure 2C:
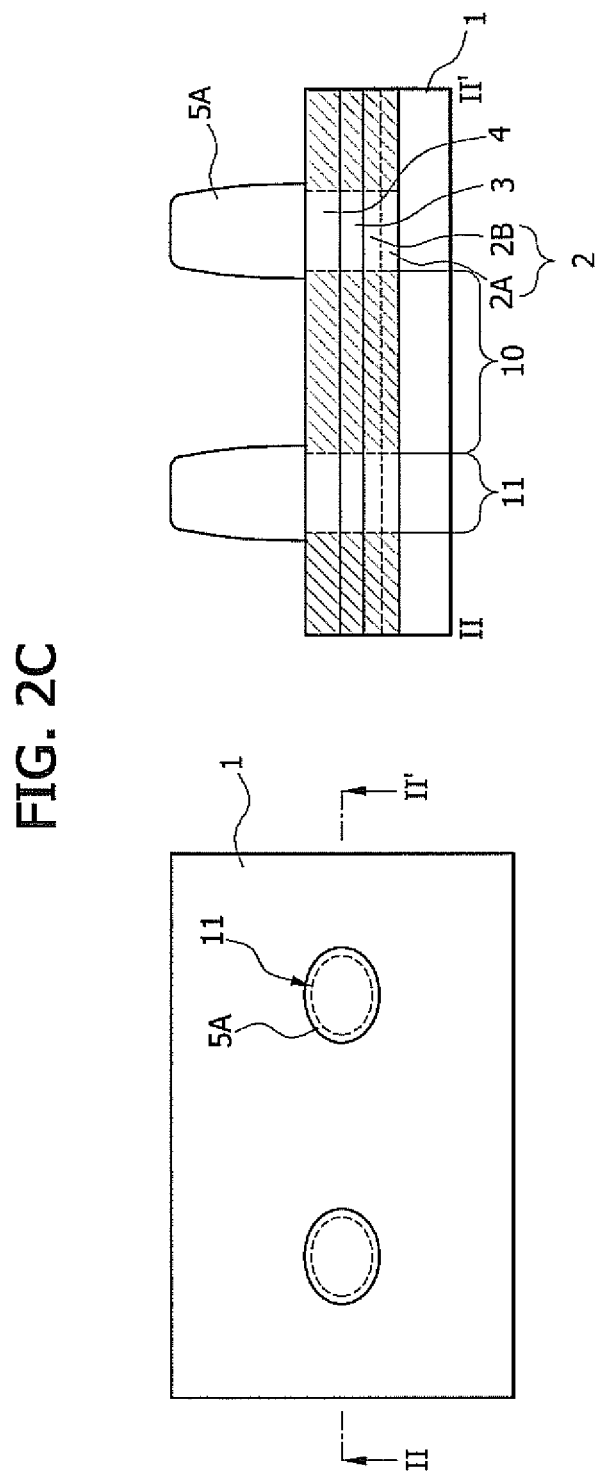

As illustrated in FIG. 2C, the etch barrier layer 6 and the anti-reflection layer 7 are etched using the mask pattern 8 as an etch barrier. In this case, a part or the entirety of the mask pattern 8 is lost. Subsequently, the hard mask layer 5 is etched using the etched etch barrier layer 6 as an etch barrier, thereby forming a hard mask layer pattern 5A.

In the process of forming the hard mask layer pattern 5A, a sidewall surface of the hard mask layer pattern 5A does not have a vertical surface but has a slope. Thus, the width of a lower surface of the hard mask layer pattern 5A is greater than that of an upper surface of the hard mask layer pattern 5A. The width of the upper surface of the hard mask layer pattern 5A is same as the width of the mask pattern 8.

Figure 2D:
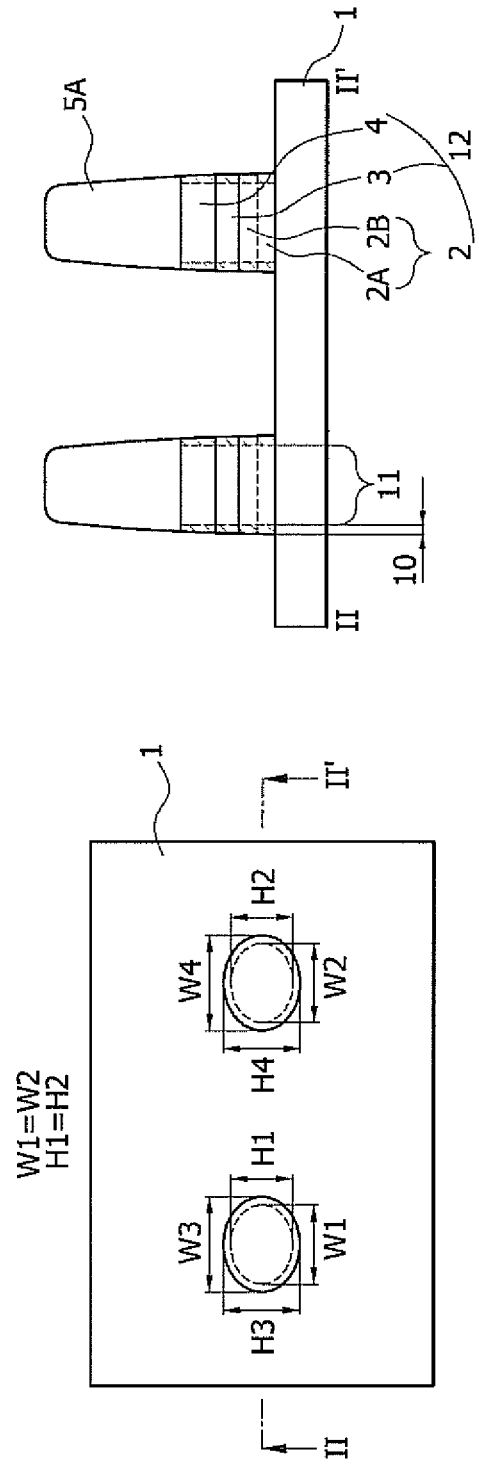

As illustrated in FIG. 2D, the magneto resistance layer is etched using the hard mask layer pattern 5A as an etch barrier, thereby forming magnetic tunnel junctions 12.

As described above, the width of the lower surface of the hard mask layer pattern 5A is greater than that of the upper surface of the hard mask layer pattern 5A. Therefore, when the magneto resistance layer is etched using the hard mask layer pattern 5A as an etch barrier, the entirety of the magnetic area 11 is included in the magnetic tunnel junction 12, and a part of the magnetic loss area 10 is also included in the magnetic tunnel junction 12. This is because the magnetic area 11 is defined/farmed by using the mask pattern 8.

In the process of patterning the magnetic tunnel junctions 12, the widths W3 and W4 and heights H3 and H4 of the magnetic tunnel junctions 12 may be different from each other depending on the distribution of etch plasma. However, since the widths W1 and W2 and heights H2 and H2 of the areas substantially having magnetization directions in the respective magnetic tunnel junctions 12, i.e., the magnetic areas 11, are the same, the magnetic characteristics of the magnetic tunnel junctions 12 are the same.

As illustrated in FIG. 2E, a capping layer 13 is formed on the substrate having the magnetic tunnel junctions 12 formed thereon.

The capping layer 13 is a thin film for protecting the magnetic tunnel junctions 12. To this end, the capping layer 13 is formed of a metal layer, e.g., at least one selected from the group consisting of Al, Cr and Ta.

Subsequently, the metal layer used as the capping layer 13 is oxidized through an oxidation process.

Metallic polymer may be produced in the process of patterning the magnetic tunnel junctions 12. Without the oxidation process, the metallic polymer may cause the first and second magnetic layers 2 and 4 to short-circuit to each other. If the oxidation process is performed after the capping layer 13 is formed, the metallic polymer is oxidized together with the capping layer 13. Hence, although the metallic polymer is absorbed in areas between the first and second magnetic layers 2 and 4, the two layers 2 and 4 are not electrically connected to each other.

As illustrated in FIG. 2F, an interlayer insulating layer 14 is formed on the oxidized capping layer 13.

The interlayer insulating layer 14 is used to insulate the magnetic tunnel junctions 12 from each other and to insulate the layers from one another. The interlayer insulating layer 14 is formed of an oxide-based material layer, e.g., at least one selected from the group consisting of a boro silicate glass (BSG) layer, a boro phopho silicate glass (BPSG) layer, a phospho silicate glass (PSG) layer, a tetra ethyl ortho silicate (TEOS) layer, a high density plasma (HDP) oxide layer and a spin on glass (SOG) layer.

Subsequently, a spin transfer random access memory is fabricated through an interconnection process.

As described above, in the spin transfer random access memory in accordance with the exemplary embodiment of the present invention, the CDs of the magnetic tunnel junctions 12 are defined not by performing an etching process but by performing an impurity doping process. Here, if the CDs of the magnetic tunnel junctions 12 are defined by performing the etching process, the CDs of the magnetic tunnel junctions 12 may be different from each other by a variable of the etch process, e.g., a distribution of etch plasma. However, if the CDs of the magnetic tunnel junctions 12 are defined by performing the impurity doping process, e.g., the ion implantation process, the CDs of magnetic tunnel junctions 12 are the same. Subsequently, although the magnetic tunnel junctions 12 are patterned through the etching process, the CDs of the magnetic tunnel junctions 12 are not substantially changed.

After the magnetic tunnel junctions 12 are patterned, the electric short circuit between the first and second magnetic layers 2 and 4 is prevented by performing the formation of the capping layer 13 and the oxidation process. In the process of patterning the magnetic tunnel junctions 12, the metallic polymer may act as a bridge for electrically connecting the first and second magnetic layers 2 and 4 to each other. However, in the present invention, the metallic polymer is oxidized by forming the capping layer 13 and subsequently performing the oxidation process. Thus, the electrical short circuit between the first and second magnetic layers 2 and 4 may be prevented.

According to the present invention, CDs of magnetic tunnel junctions are controlled not through an etching process but through an impurity doping process, thereby improving the CD uniformity of the magnetic tunnel junctions. Since a magnetic layer used in the magnetic tunnel junction is a thin film that is hard to etch, it is difficult to control the CD of the magnetic tunnel junction through the etching process. Thus, in the present invention, the CD of the magnetic tunnel junction is controlled through the impurity doping process.

If an impurity is doped into the magnetic layer, the magnetic layer loses magnetism, and accordingly, it is easy to etch the magnetic layer. Thus, when the magnetic tunnel junction is patterned, pattern collapse or pattern distortion of the magnetic tunnel junction is not generated by an etching defect.

Since a magnetic loss area unrelated to magnetization characteristics of the magnetic tunnel junction surrounds, together with a capping layer, a circumference of a magnetic area for maintaining magnetism, damage of the magnetic tunnel junction is protected from external factors (e.g., etch plasma and wet cleansing solution).

Thus, the magnetization characteristics of the magnetic tunnel junctions can be unified, and accordingly, the operation stability and reliability of the spin transfer random access memory may be obtained.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a magnetic tunnel junction element, comprising:
   forming a magneto resistance layer including a first magnetic layer, an insulation layer and a second magnetic layer on a substrate;
   forming a magnetic loss area by doping a magnetic loss impurity into a region of the magneto resistance layer to cause a magnetic loss; and
   etching the magnetic loss area to form a magnetic tunnel junction element.

2. The method of claim 1, further comprising forming a hard mask layer and a mask pattern on the magneto resistance layer after forming the magneto resistance layer.

3. The method of claim 2, wherein the forming of the magnetic loss area comprises doping the magnetic loss impurity into the magneto resistance layer using the mask pattern as an etching mask.

4. The method of claim 2, wherein the etching of the magnetic loss area is performed using the mask pattern as an etch barrier.

5. The method of claim 1, wherein the magnetic loss impurity includes at least one selected from the group consisting of Ga, Ge, As and In.

6. The method of claim 1, wherein the first magnetic layer comprises a pinning layer including at least one selected from the group consisting of IrMn, PtMn, MnO, MnS, MnTe, $MnF_2$, $FeF_2$, $FeCl_2$, FeO, $CoCl_2$, CoO, $NiCl_2$ and NiO, and a pinned layer including at least one selected from the group consisting of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, EuO and $Y_3Fe_5O_{12}$.

7. The method of claim 1, wherein the second magnetic layer includes at least one selected from the group consisting of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, EuO and $Y_3Fe_5O_{12}$.

8. The method of claim 1, further comprising:
   forming a capping layer to surround the magnetic tunnel junction element; and
   oxidizing the capping layer.

9. The method of claim 8, wherein the capping layer includes at least one selected from the group consisting of Al, Cr and Ta.

10. A semiconductor device including a magnetic tunnel junction element, comprising:
    a patterned magneto resistance layer; and
    an electrode layer on the patterned magneto resistance layer wherein the patterned magneto resistance layer includes a magnetic loss area formed by doping a magnetic loss impurity except for a region for maintaining magnetic properties, wherein the magnetic loss impurity causes a magnetic loss.

11. The semiconductor device of claim 10, wherein the magnetic loss impurity includes at least one selected from the group consisting of Ga, Ge, As and In.

12. The semiconductor device of claim 10, wherein the patterned magneto resistance layer includes a first magnetic layer, an insulation layer and a second magnetic layer.

13. The semiconductor device of claim 12, wherein the first magnetic layer comprises a pinning layer including at least one selected from the group consisting of IrMn, PtMn, MnO, MnS, MnTe, $MnF_2$, $FeF_2$, $FeCl_2$, FeO, $CoCl_2$, CoO, $NiCl_2$ and NiO, and a pinned layer including at least one selected from the group consisting of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, EuO and $Y_3Fe_5O_{12}$.

14. The semiconductor device of claim 13, wherein the second magnetic layer includes at least one selected from the group consisting of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, EuO and $Y_3Fe_5O_{12}$.

15. The semiconductor device of claim 10, further comprising a capping layer that surrounds the patterned magneto resistance layer and the electrode layer.

16. The method of claim 15, wherein the capping layer including at least one selected from the group consisting of Al, Cr and Ta.

* * * * *